United States Patent [19]

Mellissinos

[11] Patent Number: 5,331,217
[45] Date of Patent: Jul. 19, 1994

[54] LOW POWER INTEGRATED CIRCUIT WHITE NOISE SOURCE

[75] Inventor: Anthony G. Mellissinos, Encinitas, Calif.

[73] Assignee: Hughes Aircraft Company, Los Angeles, Calif.

[21] Appl. No.: 900,965

[22] Filed: Jun. 18, 1992

[51] Int. Cl.$^5$ .............................. H03K 4/00; H03B 1/00
[52] U.S. Cl. .................................... 307/260; 328/165
[58] Field of Search ................ 307/260, 264; 328/165; 331/149; 330/78

[56]  References Cited

U.S. PATENT DOCUMENTS

| 3,944,945 | 3/1976  | Corte et al. ........................... 331/78 |
| 4,151,471 | 4/1979  | Packard et al. ...................... 328/165 |
| 4,175,258 | 11/1979 | Borkowski et al. .................. 331/78 |

FOREIGN PATENT DOCUMENTS

| 905019  | 9/1962  | United Kingdom . |
| 1131057 | 10/1968 | United Kingdom . |
| 1214517 | 12/1970 | United Kingdom . |
| 1240629 | 7/1971  | United Kingdom . |

Primary Examiner—Curtis Kuntz
Assistant Examiner—Sinh Tran
Attorney, Agent, or Firm—W. C. Schubert; W. K. Denson-Low

[57] ABSTRACT

A low power white noise source is fabricated on an integrated circuit. The noise source includes a bipolar junction transistor ($Q_{BJT}$) having an emitter terminal coupled to a common circuit potential, a collector terminal coupled to a source of current (CS), and a base terminal coupled through a resistance ($R_B$) to a bias signal ($V_{bias}$). The resistance has a resistance value selected to enhance a noise signal generated by the transistor in a collector current thereof. The noise source further includes a transresistance amplifier (AMP) having an input coupled to the collector terminal for converting the noise signal to a voltage signal (NOISE OUT) having white noise characteristics.

5 Claims, 1 Drawing Sheet

LOW POWER INTEGRATED CIRCUIT WHITE NOISE SOURCE

FIELD OF THE INVENTION:

This invention relates generally to signal generators and, in particular, to white noise signal generators.

BACKGROUND OF THE INVENTION:

It is known to the inventor to generate a broad spectrum noise signal, or "white" noise, with a circuit that employs an avalanche breakdown of a pn junction. Various embodiments of this technique include the use of a Zener diode, the use of a lateral diode biased to "soft" breakdown, or the use of an emitter-collector breakdown of a bipolar junction transistor (BJT) that is operated with an open base circuit.

However, the noise produced by any of these three embodiments is characteristically of relatively low power. Also, the Zener diode embodiment typically requires a supply voltage in excess of the five volts that is readily available in many systems. The use of a voltage doubler, to increase the supply voltage for the Zener diode, typically contaminates the noise signal and requires a large amount of capacitance. The use of a voltage doubler also adds complexity and consumes substrate surface area, an important consideration when integrating the noise source onto an integrated circuit. The lateral diode embodiment exhibits a large and poorly controlled output impedance that tends to reduce the bandwidth of the noise source. For the BJT approach (also referred to as a BVceo approach) the breakdown voltage is often too near the minimum supply voltage, and is also too strong a function of the transistor current gain, to properly control. The output noise also typically exhibits a narrow bandwidth.

It is thus an object of the invention to provide a flat white noise spectrum that is generated with a supply voltage that is less than that required for pn junction breakdown-based noise sources, allowing operation with a single five volt supply, or with a lower voltage battery.

It is a further object of the invention to provide a white noise source having a lower output impedance, a higher noise power, and a wider noise bandwidth, than is obtained with a conventional junction breakdown white noise source.

SUMMARY OF THE INVENTION

The foregoing and other problems are overcome and the objects of the invention are realized by a circuit that generates white noise by placing a resistance in series with the base of a bipolar junction transistor (BJT). The resulting collector current noise of the BJT is transresistance amplified to produce a large amplitude, broadband source of noise.

More specifically, the invention teaches a noise source that is fabricated on an integrated circuit. The noise source includes a bipolar junction transistor having an emitter terminal coupled to a common circuit potential, a collector terminal coupled to a source of current, and a base terminal coupled through a resistance to a bias signal. The resistance has a resistance value selected to enhance a noise signal generated by the transistor in a collector current thereof. The noise source further includes a transresistance amplifier having an input coupled to the collector terminal for converting the noise signal to a voltage signal having white noise characteristics.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

As employed herein the following terms are intended to have the following meanings.

White noise is a random noise, such as shot noise and thermal noise, having a constant energy per unit bandwidth that is independent of a central frequency of a frequency band. White noise is also considered to be a noise having an amplitude that is a random (Gaussian) variable, but which has an equal energy distribution over all frequencies of interest.

A transresistance amplifier is an amplifier that supplies an output voltage ($e_{out}$) that is proportional to an input current ($i_{in}$). The transfer function of the amplifier is given by:

$$e_{out}/i_{in} = R_m,$$

where $R_m$ is the transresistance.

Figure 1:
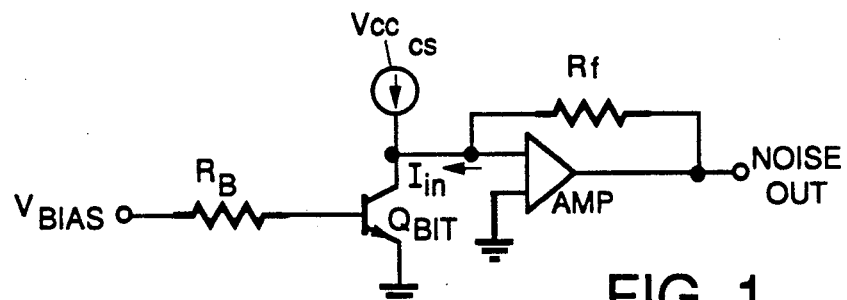
FIG. 1 is a simplified schematic diagram of an integrated, resistor-based thermal noise source.

FIG. 1 shows a schematic diagram of a noise source that is constructed and operated in accordance with the invention. A resistance ($R_B$) is connected to the base of an npn Bipolar Junction Transistor (BJT), designated as $Q_{BJT}$. $R_B$ couples a bias signal ($V_{bias}$) to the base of $Q_{BJT}$. A DC current source (CS) is coupled to the collector of $Q_{BJT}$, and the emitter of $Q_{BJT}$ is coupled to a common circuit potential. The collector of $Q_{BJT}$ is coupled to an input of a transresistance amplifier (AMP) having a feedback resistance ($R_f$). The operation of the transresistance amplifier converts a collector current ($I_{in}$) of $Q_{BJT}$ to a voltage. This voltage is a signal designated NOISE OUT.

In operation, CS biases $Q_{BJT}$ into operation, and the collector noise current, enhanced by the relatively large value of $R_B$, and a small DC offset current are injected into the large transimpedance resistance of $R_f$.

The circuit operates to enhance the noise characteristics of $Q_{BJT}$. That is, the circuit provides an equivalent BJT having enhanced noise characteristics.

Figure 2:
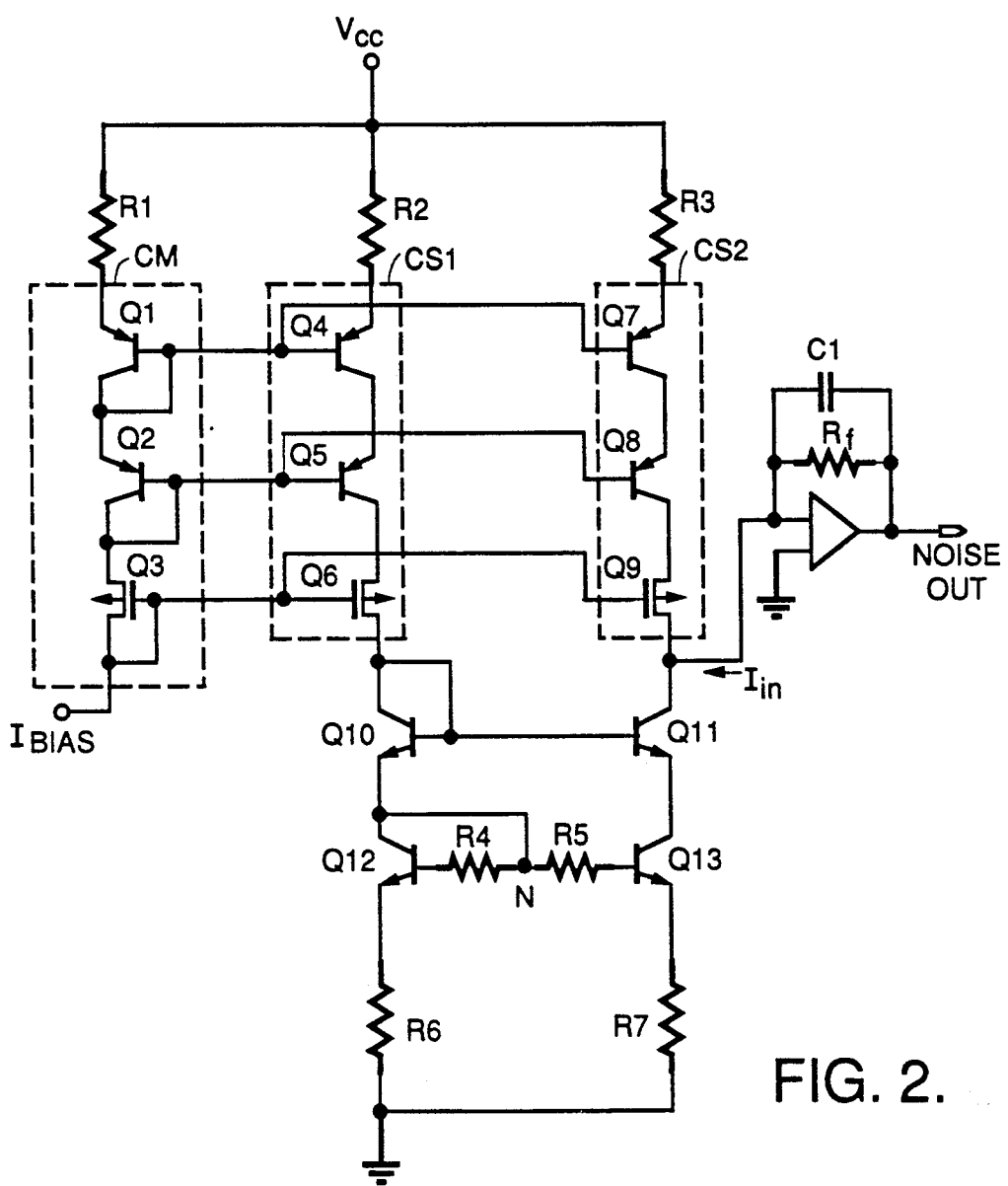
FIG. 2 is a more detailed schematic diagram of an embodiment of the thermal noise source of FIG. 1.

FIG. 2 is a more detailed schematic diagram of the circuit of FIG. 1. A resistor R1 is in combination with transistors Q1, Q2, and Q3. These are designated CM. A bias signal (IBIAS) is input to the CM. Resistor R2 and transistors Q4, Q5, and Q6 form a first DC current source (CS1) for a first BJT Q12. Resistor R3 and transistors Q7, Q8, and Q9 form a second DC current source (CS2) for a second BJT Q13. Q10 and Q11 are connected in cascode with Q12 and Q13, respectively, to increase the overall bandwidth of Q12 and Q13 and to isolate the output noise from power supply fluctuations.

In accordance with an aspect of the invention Q12 and Q13 each have a relatively large resistance coupled to the base, the resistance being R4 and R5, respectively. R4 and R5 share a common node (N) into which a bias signal derived from IBIAS is injected.

Emitter resistors R6 and R7 couple Q12 and Q13 to a common circuit potential and are provided to reduce temperature sensitivity. The output is taken from the collector of Q11 and is provided to the transresistance amplifier (AMP) having the feedback resistance $R_f$ coupled between the input and the output. $R_f$ is preferably paralleled with a capacitance (C1) to stabilize the amplifier. The output of AMP is the signal NOISE OUT. In a presently preferred embodiment of the invention, all of the components shown in FIG. 2 are integrated onto a common substrate, and R4 and R5 are polysilicon resistors.

By example, and not as a limitation upon the practice of the invention, R4 and R5 are each equal to approximately 12K ohms, a value selected to enhance the inherent noise generation characteristics of BJTs Q12 and Q13. Also by way of example, R6 and R7 are each equal to approximately 200 ohms, and $R_f$ is equal to approximately 60K ohms. A suitable value for C1 is approximately 0.15 picofarads. R1 has a value of approximately 700 ohms, R2 has a value of approximately 1200 ohms, and R3 has a value of approximately 1300 ohms. CM, CS1 and CS2 form a current mirror and provides DC bias. Vcc is approximately five volts, although operation at lower or higher supply voltages may be readily accomplished.

For the circuit of FIG. 2, $F_{-3dB}$ is approximately 14.2 MHz, and the resulting voltage distribution is Gaussian. The noise characteristics have been found to be less sensitive to process variations than are the noise characteristics of the conventional noise sources described above. Furthermore, the characteristically low output impedance of AMP simplifies the design of subsequent amplifier stages.

In general, the maximum collector current noise is a function of the ratio of $R_B$ and the internal base resistance of the $Q_{BJT}$. The bias current, and resulting voltage at node N of FIG. 2, sets the value of the internal base resistance. The bias current is set to optimize both the collector noise current and the bandwidth of the resulting noise. Typically, $I_{BIAS}$ is approximately 200 nA and V(N) is approximately one volt.

Suitable uses for the white noise source of the invention include, but are not limited to, a low voltage, non-deterministic randomizer and an on-chip white noise source useful for the self-test of amplifier and filter transfer functions.

While the invention has been particularly shown and described with respect to a presently preferred embodiment thereof, it will be understood by those skilled in the art that changes in form and details may be made therein without departing from the scope and spirit of the invention.

What is claimed is:

1. A noise source fabricated on an integrated circuit, comprising:
   a plurality of bipolar junction transistors each having an emitter terminal coupled to a circuit common potential, a collector terminal coupled to an output of an associated current source, and a base terminal coupled through an associated resistance to a bias signal, the associated resistance coupled to the base terminal of each of said transistors having a resistance value selected to enhance a noise signal generated by said transistor in a collector current thereof; and
   transresistance amplifier means having an input coupled to said collector terminal of one of said transistors for converting said noise signal to a voltage signal having white noise characteristics.

2. A noise source as set forth in claim 1 and further comprising current mirror means having an input for receiving a current signal and including means for generating said bias signal.

3. A noise source as set forth in claim 1 wherein an emitter of each of said transistors is coupled to the common circuit potential through an associated emitter resistance, said emitter resistances having a value selected to reduce a temperature sensitivity of said transistors.

4. A noise source as set forth in claim 1 wherein each of said transistors is coupled, through said collector terminal, in cascode with another bipolar junction transistor.

5. A noise source as set forth in claim 2 wherein said current mirror means and each of said associated current sources are coupled to a supply voltage, and wherein said supply voltage is equal to approximately five volts or less.

* * * * *